United States Patent [19]

Amemiya et al.

[11] Patent Number: 5,385,624
[45] Date of Patent: Jan. 31, 1995

[54] APPARATUS AND METHOD FOR TREATING SUBSTRATES

[75] Inventors: Yutaka Amemiya; Akihito Toda, both of Yamanashi, Japan

[73] Assignee: Tokyo Electron Limited, Tokyo, Japan

[21] Appl. No.: 800,026

[22] Filed: Nov. 29, 1991

[30] Foreign Application Priority Data

Nov. 30, 1990 [JP] Japan .................. 2-335671

[51] Int. Cl.$^6$ .................................. H01L 21/00
[52] U.S. Cl. .................... 156/345; 156/643; 156/659.1; 118/723 E; 118/723 ER
[58] Field of Search ............ 156/643, 659.1, 345; 118/723, 725; 134/3

[56] References Cited

U.S. PATENT DOCUMENTS

| | | | |
|---|---|---|---|
| 4,431,898 | 2/1984 | Reinberg et al. | 219/121.4 |
| 4,828,369 | 5/1989 | Hotomi | 350/357 |
| 4,919,783 | 4/1990 | Asamaki et al. | |
| 5,164,034 | 11/1992 | Arai et al. | 156/345 |
| 5,284,544 | 2/1994 | Mizutani et al. | 156/643 |

FOREIGN PATENT DOCUMENTS

| | | |
|---|---|---|
| 0367568 | 5/1990 | European Pat. Off. . |
| 0451943 | 10/1991 | European Pat. Off. . |
| 54-3343 | 2/1979 | Japan . |
| 58-168230 | 10/1983 | Japan . |
| 62-7271 | 2/1987 | Japan . |
| 62-10687 | 3/1987 | Japan . |
| 2-072620 | 3/1990 | Japan . |

OTHER PUBLICATIONS

Patent Abstracts of Japan, vol. 12, No. 362 (E–663), Sep. 28, 1988, & JP-A-63-116-428, May 20, 1988, T. Harada, et al., "Dry Etching Method".

Primary Examiner—R. Bruce Breneman
Assistant Examiner—George Goudreau
Attorney, Agent, or Firm—Oblon, Spivak, McClelland, Maier & Neustadt

[57] ABSTRACT

A substrates treating apparatus comprising a chamber provided with a section at which a semiconductor wafer is treated and with another section at which plasma is generated. A supplier for supplying mixed gas ($O_2 + CF_4$) into the plasma generating section in the chamber, high frequency electrodes for changing the gas into plasma, an ion trap for trapping ions in the plasma to send neutral radicals into the wafer treating section, and an exhaust mechanism for exhausting the wafer treating section.

3 Claims, 4 Drawing Sheets

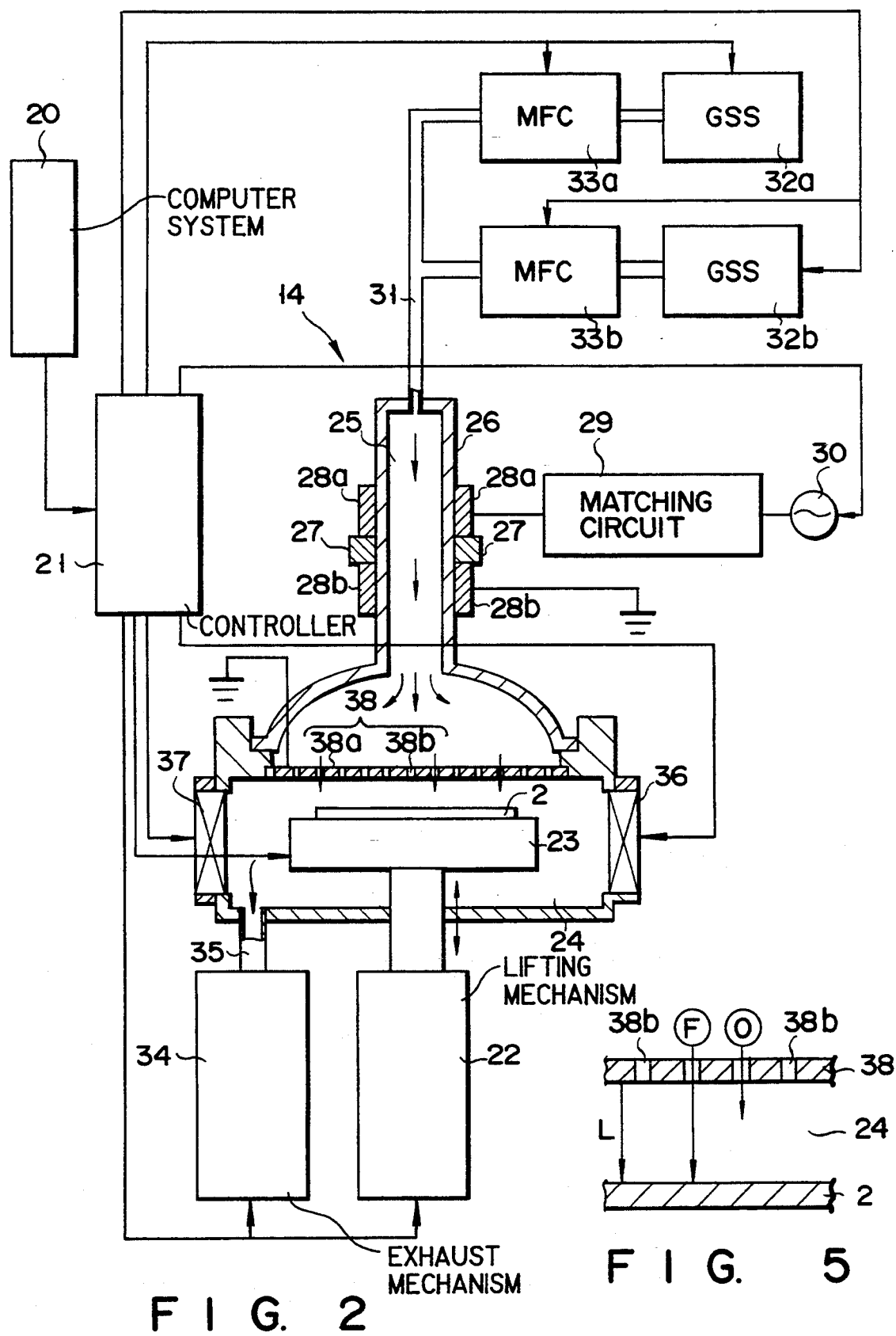
F I G. 2
F I G. 5

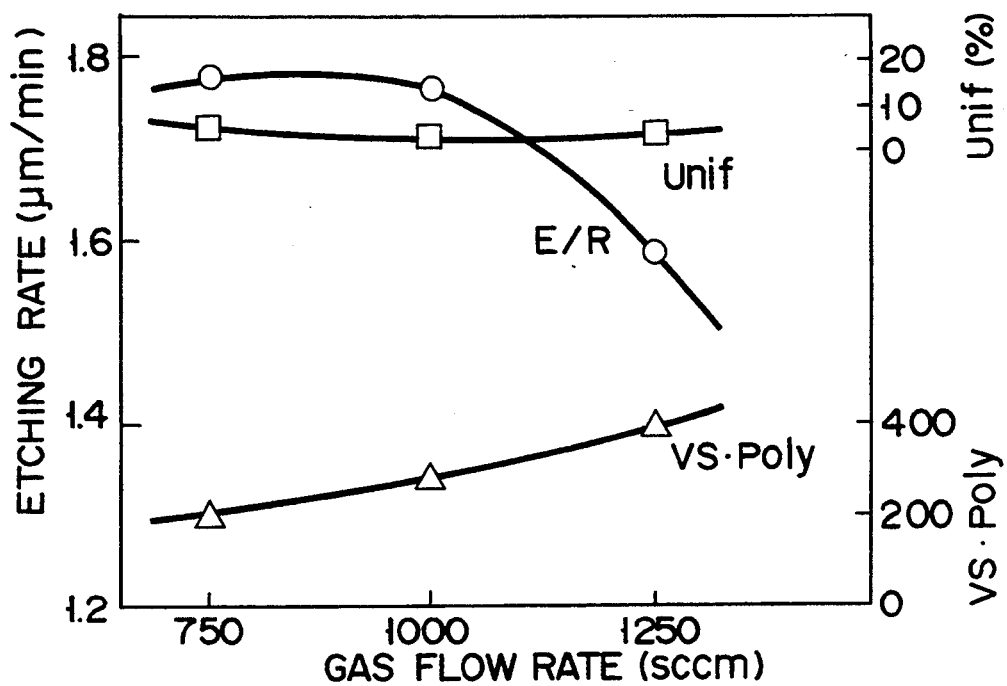
F I G. 8
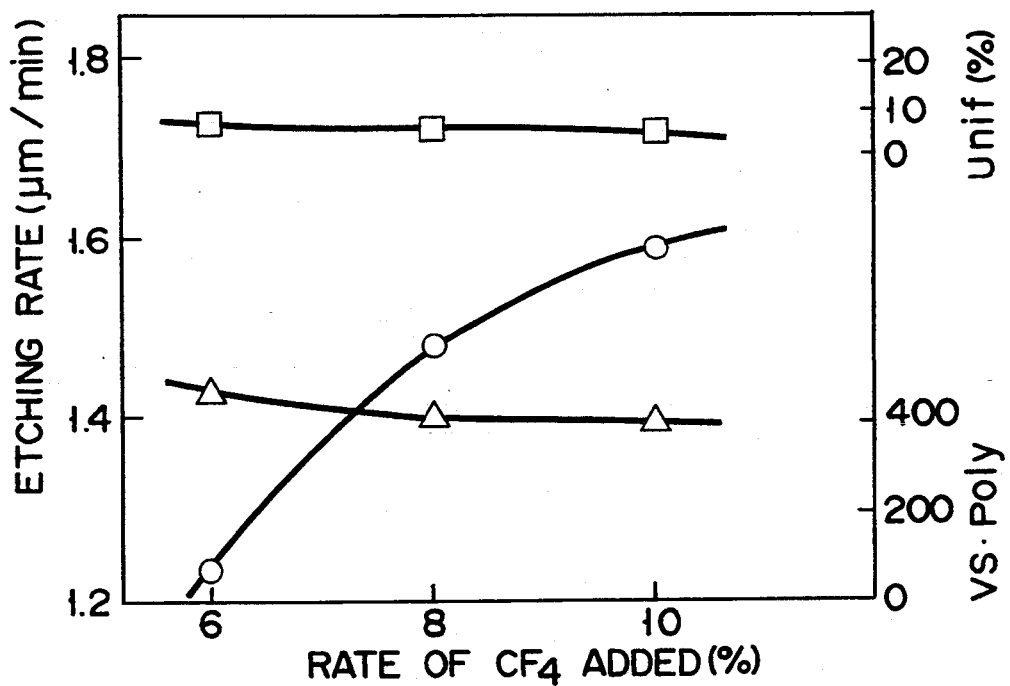
F I G. 9

APPARATUS AND METHOD FOR TREATING SUBSTRATES

BACKGROUND OF THE INVENTION

1. Field of the Invention

The present invention relates to an apparatus for etching and ashing substrates such as semiconductor wafers. It also relates to a method of doing the same.

2. Description of the Related Art

A micro-pattern of an integrated circuit on a semiconductor is formed by etching an undercoat film on the semiconductor wafer while using an organic high polymer photo-resist film as its mask. The photo-resist film is removed from the surface of the semiconductor wafer after this etching process.

A plasma etching apparatus having an independent unit chamber to the etching process has been used as one of the substrate treating apparatuses.

An ashing apparatus having an independent unit chamber to the ashing process has also been used as one of the substrate treating apparatuses.

A sequence treating apparatus which is a combination of plural treatment units to achieve various functions is now in use. In the case of this sequence treating apparatus, the anisotropic etching is carried out in a main chamber, the isotropic etching (or light etching for removing damage portion of the silicon film) is then carried out in an after-treatment chamber and the ashing is finally carried out in an ashing chamber.

When it is tried to prevent the substrate from being excessively damaged at the isotropic etching and ashing processes, however, it becomes difficult to achieve a high etching rate (or high speed etching) or a high ashing rate (or high speed ashing). Therefore, the so-called batch process by which plural semiconductor wafer are treated at the same time is used to treat the wafers at low plasma current for a long time (of about 1 hour, for example).

On the other hand, it is easy to achieve a high etching rate at the anisotropic etching process because the plasma etching can be carried out using high frequency current. Therefore, the wafers are usually treated one by one.

In the case of the conventional substrate treating apparatus, therefore, the anisotropic etching step, isotropic etching step and the ashing step must be carried out by their corresponding apparatuses and the wafers to be treated must be carried between these apparatuses by hands or by automatic carriage means. This makes it necessary to carry the wafers between these apparatuses and carry them into and out of these apparatuses, thereby making low the throughput to put together all of the processes.

In addition, the wafers are contacted with atmosphere while being carried between these apparatuses. This allows dust, impurities and water in atmosphere to adhere to the wafers, thereby creating fault patterns and making the revival of treatment worse. Further, the floor space occupied by the system is increased.

Particularly when the semiconductor wafer is contacted with atmosphere while being carried from the metal etching process to the resist film removing process, a micro-amount of chlorine etching gas remaining on the semiconductor wafer reacts with water in atmosphere to corrode the metal layer on the wafer. If this corroded layer is not removed from the surface of the semiconductor wafer, therefore, the yield of semiconductor device decreases.

SUMMARY OF THE INVENTION

An object of the present invention is therefore to provide an apparatus for treating substrates and also to provide a method for doing the same, said apparatus and method being capable of making the treatment speed higher, increasing the throughput, reducing the floor space occupied by the system, and preventing the substrates such as semiconductor wafers from being contaminated by atmosphere.

According to an aspect of the present invention, there can be provided a substrates treating apparatus comprising a chamber provided with a section at which the substrates are treated and with another section at which plasma is generated, means for supplying gas into the plasma generating section, electrode means for changing the gas into plasma in the plasma generating section, an ion trap means arranged between the plasma generating section and the substrates treating section to trap ions in the plasma so as to allow neutral radicals to be introduced into the substrates treating section, and means for exhausting the substrates treating section.

According to an another aspect of the present invention, there can be provided a substrates treating method comprising preparing the substrate at a substrates treating section in a chamber, introducing gas into a plasma generating section in the chamber, changing the gas into plasma in the plasma generating section, taking out neutral radicals from the plasma, and acting the neutral radicals on the substrate in the substrates treating section.

It is preferable that the inner diameter of the plasma generating section is made smaller than that of the substrates processing section. The interval between the electrodes is thus made small to generate plasma of high density. It is preferable that the inner diameter of the plasma generating section is in a range of 20–60 mm.

Further, it is preferable that a substrate mount is provided with a lifter means to change the interval between the substrate and the ion trap. In this manner it is possible to control the ratio of fluorine radicals allowed to reach the substrate, which are long in life, to oxyger radicals allowed to reach the substrate, which are short in life.

According to a substrates treating apparatus of the present invention, plasma of high density can be generated and introduced into the substrates treating section through the ion trap to act on the substrate to be treated. Therefore, only radicals are allowed to act on the substrate to be treated, so that the isotropic etching can be carried out at a higher rate without damaging the substrate by ions. Even when the substrates are treated one by one, for example, a throughput in the anisotropic etching can be achieved substantially same in the isotropic etching. The substrates treating section can be connected to a section in which the anisotropic etching apparatus is housed, to thereby treat the substrates one by one while keeping them not contacted with atmosphere.

According to a substrates treating method of the present invention, process gas can be a mixture of ashing and etching gases, the ashing and isotropic etching processes can be carried out at the same time, and the rate of the ashing speed relative to the etching speed can be controlled to a desired value by adjusting at least one of alternative current, the pressure and flow rate of gas and the rate of gases mixed. The ashing and isotropic etching processes can be therefore carried out in a same chamber to thereby make the throughput higher. In addition, the floor space occupied by the system can be reduced because the number of apparatuses used is reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram showing the main portion of an after-treatment chamber (ATC) sectioned, which serves as the substrates treating apparatus according to the present invention;

FIG. 5 is a vertically-sectioned view showing an ion trap and the semiconductor wafer partial and enlarged in order to compare and explain performances of oxygen radicals and fluorine radicals;

FIG. 8 is a graph showing the interrelation of the flow rate of process gas relative to the ER, Unif and VS. Poly; and FIG. 9 is a graph showing the interrelation of the rate of $CF_4$ added to process gas relative to the ER, Unif and VS. Poly.

DETAILED DESCRIPTION OF THE PREFERRED EMBODIMENT

An embodiment of the present invention will be described with reference to the accompanying drawings.

Figure 1:
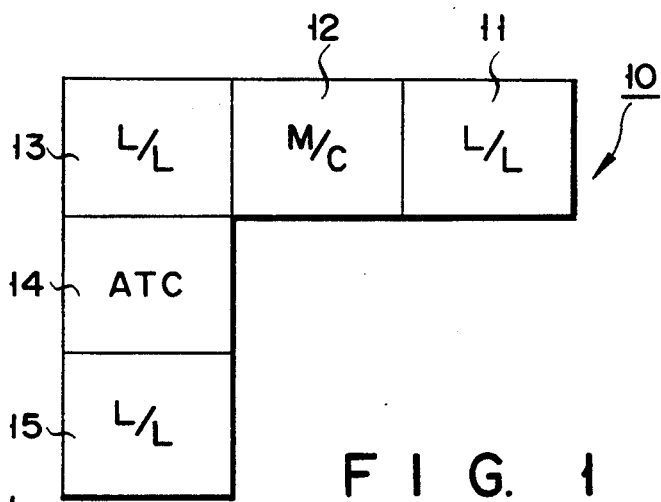
FIG. 1 shows the whole layout of the etching treatment system in which the substrates treating apparatus according to an embodiment of the present invention is included.

As shown in FIG. 1, a system 10 for etching and ashing semiconductor wafers comprises plural chamber units 11–15. A main chamber (MC) 12 is located between load lock chambers (LLC) 11 and 13 and an after-treatment chamber (ATC) 14 between load lock chambers 13 and 15. Each of the load lock chambers 11, 13 and 15 is provided with a handling device (not shown), by which semiconductor wafers can be carried one by one into and out of the chamber through a gate section (not shown).

A cassette conveying passage (not shown) is arranged adjacent to a front gate of the first load lock chamber 11. A carriage robot (not shown) runs on the cassette conveying passage to convey wafer cassettes from a developing section (not shown) to a cassette station (not shown). The cassette station is located in front of the front gate of the first load lock chamber 11.

Similarly, a cassette station (not shown) is located adjacent to a rear gate of the third load lock chamber 15.

Exhaust and nitrogen gas supply pipes (not shown) are passed through a wall of the load lock chambers 11, 13 and 15, respectively.

A pair of plate electrodes (not shown) parallel to each other are arranged in the main chamber 12 and a Si film on the wafer is anisotropy-etched by plasma generated between the electrodes. Exhaust pipe (not shown) and process gas supply pipe (not shown) are passed through a wall of the main chamber 12.

The after-treatment chamber (ATC) 14 will be described referring to FIG. 2.

A wafer mount 23 which can hold a semiconductor wafer 2 thereon by an electrostatic chuck device, for example, is arranged in the ATC 14. This wafer mount 23 is housed in a treating section 24 which is shaped like a hollow cylinder having a diameter of 200 mm, for example. The wafer mount 23 is moved up and down by a lifter means 22 and it is also provided with a heater (not shown).

A plasma generating section 25 is located above the treating section 24, which is shaped like a hollow cylinder having a diameter smaller than that of the treating section 24. In other words, a cylindrical tube 26 made of quartz and having a diameter of 40 mm, for example, smaller than that of the treating section 24 is connected to upper portion of the treating section 24. A pair of electrodes 28a and 28b are wound round the quartz-made cylindrical tube 26 with an insulating spacer 27 interposed between them.

One 28a of these electrodes is connected to a high frequency power source 30 via a matching circuit 29 while the other 28b is grounded. A gas supply pipe 31 is connected to the upper end of the cylindrical tube 26 and it is also connected to process gas supply sources (GSS) 32a and 32b through mass flow controllers (MFC) 33a and 33b.

Oxygen gas is contained in the first GSS 32a and $CF_4$ gas in the second GSS 32b.

An exhaust pipe 35 of an exhaust device 34 is connected to the lower portion of the treating section 24. Gate devices 36 and 37 are arranged on both sides of the treating section 24 to allow the semiconductor wafer 2 to be carried into and out of the treating section 24. The ATC 14 is partitioned from the second and third load lock chambers 13 and 15 by these gate devices 36 and 37.

Further, an ion trap 38 is provided between the treating section 24 and the plasma generating section 25. This ion trap 38 is made by forming a plurality of holes 38b (each having a diameter of 0.2–0.5 mm, for example) in a conductive aluminium plate 38a, for example, and it is earthed. Ions in plasma generated at the plasma generating section 25 are caught by the ion trap 38 so as to allow only those radicals which are electrically neutral to act on the semiconductor wafer 2. The ion trap 38 may be a mesh-like electrode.

A controller 21 backed up by a computer 20 is connected to power source switches for the means of the ATC 14. Namely, it is arranged that command signal is sent from the controller 21 to the high frequency power source 30, GSS 32a, 32b, MFC 33a, 33b, lifter device 22, exhaust device 34, gate device 36, 37, electrostatic chuck device, heating device for heating the wafer mount 23 and a wafer handling device (not shown).

Figure 3:
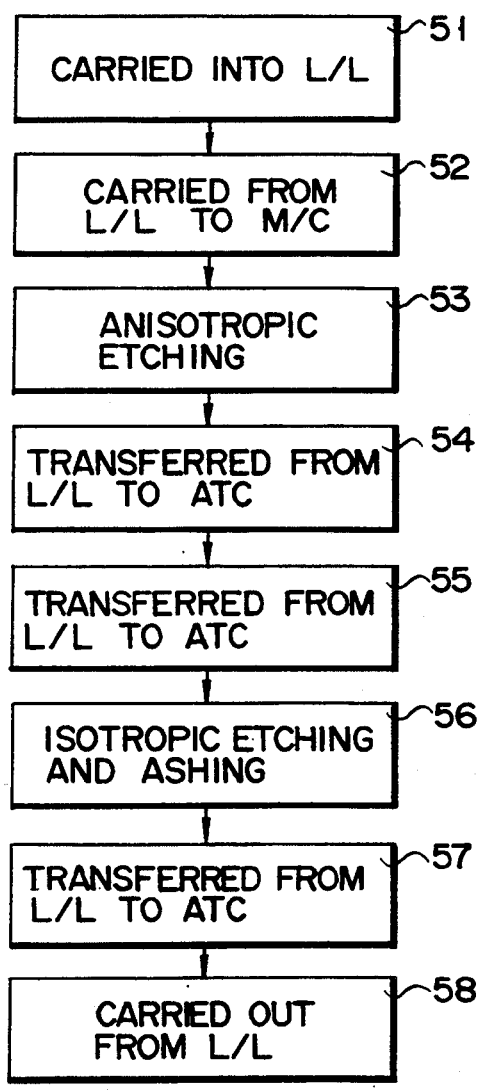
FIG. 3 is a flow chart showing steps of etching and ashing a semiconductor wafer.

The case where the semiconductor wafer 2 is etched and ashed by the etching system 10 will be described referring to FIGS. 3 through 5.

The silicon wafer 2 which has been coated with a photo-resist and then developed is taken out from the cassette and carried into the first load lock chamber 11 by the handling device (step 51). The first load lock chamber 11 is closed by its front gate and then exhausted. When the internal pressure of the first load lock chamber 11 becomes substantially the same as that of the main chamber 12, the rear gate of the first load lock chamber 11 is opened to communicate the first load lock chamber 11 with the main chamber 12. The wafer 2 is carried from the first load lock chamber 11 into the main chamber 12 (step 52).

Figure 4A:
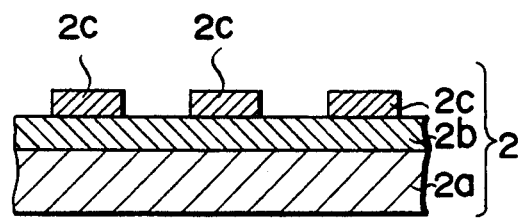
FIGS. 4A through 4C are vertically-sectioned views showing the semiconductor wafer treated by the etching and ashing steps, respectively.
Figure 4B:
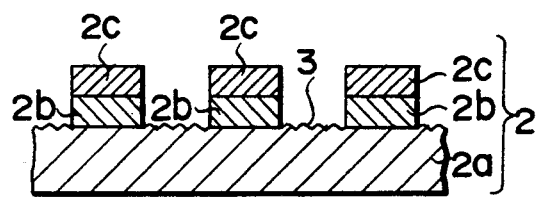

Anisotropic etching is applied to the wafer 2 in the main chamber 12 (step 53). A layer 2b of $SiO_2$ on the wafer 2 is thus partially removed. In other words, the wafer 2 which is under the state shown in FIG. 4A is changed as shown in FIG. 4B. Reference numeral 2a represents the layer of silicon and 2c the layer of photo-resist. That area 3 on the surface of the silicon layer 2a from which the $SiO_2$ layer has been removed by the anisotropic etching is damaged as shown in FIG. 4B.

The rear gate of the main chamber 12 is then opened and the wafer 2 is carried from the main chamber 12 into the second load lock chamber 13 by the handling device (step 54). The rear gate is closed and the load lock chamber 13 is exhausted until the internal pressure of the second load lock chamber 13 becomes substantially the same as that of the ATC 14. The front gate 36 of the ATC 14 is opened and the wafer 2 is carried from the load lock chamber 13 into the ATC 14 by the handling device (step 55). The wafer 2 is fixed on the wafer mount 23 by the electrostatic chuck device. The wafer mount 23 is previously heated to a predetermined temperature or about 50° C., for example.

The wafer mount 23 is lifted by the lifter device 22 and the interval L between the ion trap 38 and the semiconductor wafer 2 is set a predetermined value of 10–50 mm, for example, where most ion radicals are present.

Exhausting the treating section 24 through the exhausting device 34 while controlling the flow rate of gas by the MFC 33a and 33b, predetermined process gas such as ($O_2$+$CF_4$) mixed gas is introduced from the gas supply sources 32a and 32b into the plasma generating section 25. At the same time, current having a predetermined high frequency of 13.56 MHz, for example, is supplied from the high frequency power source 30 to the electrodes 28a and 28b through the matching circuit 29.

Plasma of high density is thus generated in the plasma generating section 25 smaller in diameter than the treating section 24 and this plasma gas is diffused as shown by arrows in FIG. 2. Ions in the plasma gas are removed while it is passing through the ion trap 38, and radicals thus left are supplied to the semiconductor wafer 2 on the wafer mount 23 to conduct the anisotropic etching to the damaged area 3 of the silicon layer 2 and the ashing to the photo-resist layer 2c at the same time (step 56). In order to apply the anisotropic etching and the ashing to the semiconductor wafer 2 to desired extents in this case, it is necessary to control the rate of the etching and the ashing.

The ratio of etching rate/ashing rate (which will be hereinafter referred to as VS. Poly) can be controlled by adjusting at least one of current added to the electrodes 28a and 28b, the gas flow rate, gas pressure and components of process gas and the interval L.

The reason why the VS. Poly is influenced by the interval L will be described referring to FIG. 5.

When the plasma is passed through the holes 38b of the ion trap 38, ions are removed from it, thereby allowing oxygen radicals and fluorine radicals to reach the wafer 2 in the treating section 24. The oxygen radicals of them react with the photo-resist layer 2c on the wafer 2 to remove the photo-resist layer 2c from the wafer 2 (ashing). On the other hand, the fluorine radicals react with the silicon layer 2a on the wafer 2 to remove the damaged area 3 to a depth of 50–100 Å (anisotropic etching).

The oxygen radicals are usually shorter in life than the fluorine radicals. When the interval L between the wafer 2 and the ion trap 38 is made too large, therefore, the oxygen radicals become oxygen gas molecules, so that the photo-resist layer 2c cannot be removed from the wafer 2 because of oxidation reaction. When the interval L is made too small, the speed of anisotropic etching is increased not to set an appropriate light etching rate.

Figure 4C:
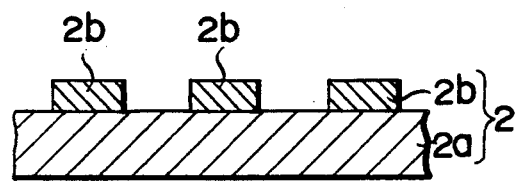
Figure 6:
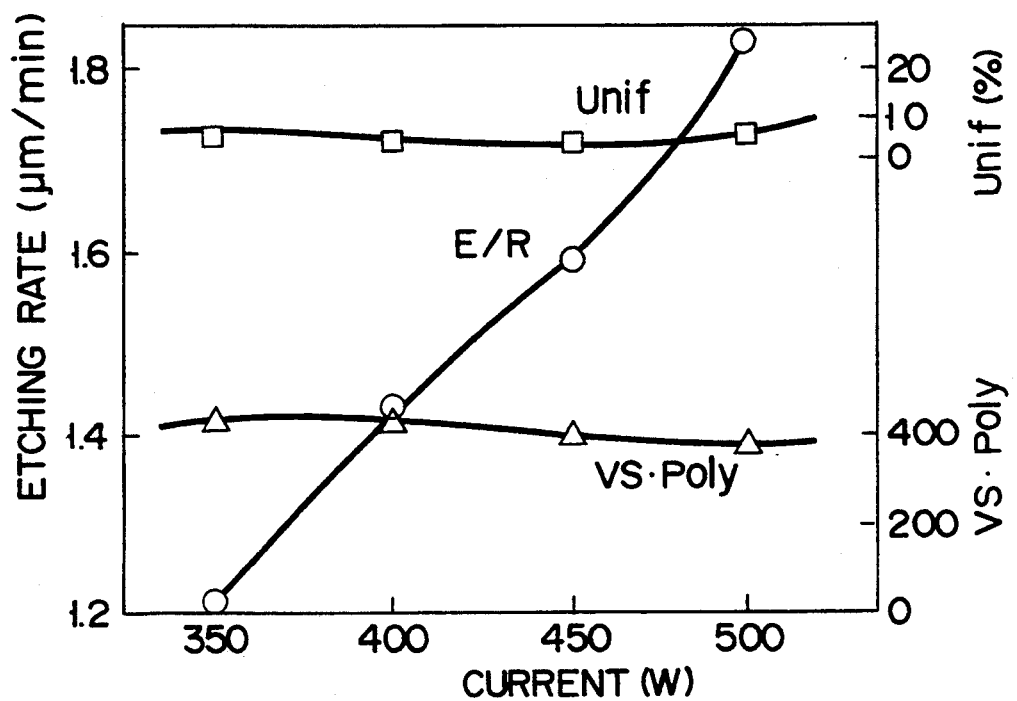
FIG. 6 is a graph showing the interrelation of alternative current added to electrodes of a plasma generator means relative to an etching rate (ER), an uniformity (Unif) and a ratio of etching rate/ashing rate (VS. Poly)
Figure 7:
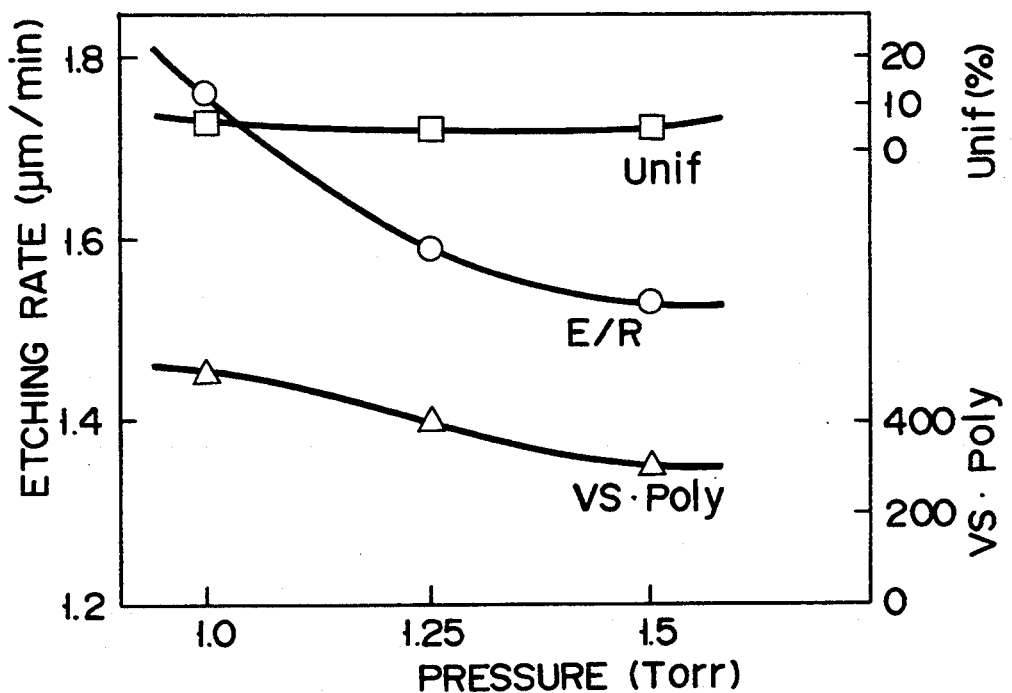
FIG. 7 is a graph showing the interrelation of the pressure of process gas relative to the ER, Unif and VS. Poly.

As shown in FIG. 4C when the light etching and ashing treatments are applied to the wafer 2 in the ATC 14, the damaged area 3 and the photo-resist layer 2c are removed from the wafer 2.

The wafer 2 is then carried from the ATC 14 into the third load lock chamber 15 (step 57) and further carried out of the load lock chamber 15 (step 58).

Merits achieved by this embodiment of the present invention will be described referring to FIGS. 6 through 9.

An etching rate (ER), an uniformity (Unif) and a ratio of etching rate/ashing rate (VS. Poly) are plotted on vertical axes of graphs shown in FIGS. 6 through 9. On the other hand, alternative current is plotted on a horizontal axis of the graph shown in FIG. 6, the pressure of treating gas on a horizontal axis of the graph in FIG. 7, the flow rate of process gas on a horizontal axis of the graph in FIG. 8, and the rate of $CF_4$ added to the process gas on a horizontal axis of the graph in FIG. 9. Except the case shown in FIG. 8, the total flow volume of $CF_4$ and $O_2$ mixed gas is 1250 SCCM and except the case shown in FIG. 9, the ratio of process gas comprises $O_2$ of 90% and $CF_4$ of 10%.

It is usually needed that the VS. Poly is selected to be 200–500.

According to the above-described ATC 14 of the present invention, plasma is generated in the plasma generating section 25 which has a diameter smaller than that of the treating section 24 and it is introduced into the treating section 24 through the ion trap 38 to act on the semiconductor wafer 2 in the section 24. Therefore, it can be generated to have a higher density and it can also be generated at a higher efficiency. The ashing rate at the ashing process can be greater than that of the conventional case (about thirty times of the conventional case), and a throughput (one wafer per minute, for example) same as that at the anisotropic etching can be attained. Further, ions in the plasma can be removed by the ion trap 38 to allow only radicals to be reacted with the semiconductor wafer 2. This enables the isotropic etching to be carried without damaging the semiconductor wafer 2.

Still further, same throughput as that at the anisotropic etching can be attained as described above. This makes it possible to provide a system wherein the main chamber 12 and the ATC 14 are connected to each other by the load lock chamber 13 to carry out the anisotropic and the isotropic etching process successively while carrying the semiconductor wafer 2 not to contact atmosphere. It can be therefore prevented that etching gas of the chlorine group remaining on the semiconductor wafer 2 reacts with water in atmosphere to corrode the metal layer of the wafer 2 at the metal etching process. Therefore, the yield of semiconductor device increases.

Still further, The isotropic etching relative to the silicon layer on the wafer 2 and the ashing relative to the photo-resist layer thereon can be carried out at the same time to thereby increase the throughput. Still further, the ashing device and the carriage means for carrying the wafer between the section at which the isotropic etching treatment is carried out and the section at which the ashing treatment is carried out are made unnecessary to thereby reduce the floor space occupied by the system. The space particularly in a clean room whose constructing cost is high can be more efficiently used.

Although AC has been used as the plasma power source in the case of the above-described embodiment, the present invention is not limited to AC but DC may be used.

According to the above-described apparatus and method for treating substrates, the treating speed can be made higher at the isotropic etching and ashing processes to thereby increase the throughput. In addition, the floor space occupied by the system can be reduced and treatments can be carried out while keeping the wafer not contacted with atmosphere.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A substrate treating apparatus, comprising:
   a chamber including a substrate treating section and a plasma generating section;
   an ion trap interposed between the substrate treating section and the plasma generating section;
   a support disposed within the substrate treating section for supporting a substrate;
   an adjustment means, connected to said support, for adjusting a distance between said substrate and said ion trap;
   a first gas source containing a first gas for an etching process;
   a second gas source containing a second gas for an ashing process;
   supply means, connected to the first and second gas sources and to the plasma generating section, for supplying said first gas and said second gas to said substrate treating section after said first gas and said second gas have passed from said plasma section through said ion trap;
   an exhaust means for exhausting said substrate treating section; and
   a process control means, connected to said plasma generating section, said supply means, and said adjustment means, for controlling said plasma generating section, said supply means and said adjustment means such that the etching process and the ashing process are simultaneously performed on the substrate in said substrate treating section.

2. A substrate treating apparatus according to claim 1, wherein:
   said first gas contained within said first gas source is a gas which has a first predetermined life for neutral radicals of said first gas which have been subjected to a treatment in said plasma section;
   said second gas contained within said second gas source is a gas which has a second predetermined life, shorter than said first predetermined life, for neutral radicals of said second gas which have been subjected to a treatment in said plasma section; and
   said adjustment means adjusts the distance between said ion trap and the substrate supported by said support such that as the substrate moves farther away from ion trap due to a movement by said adjustment means, an affect of the neutral radicals of said second gas on said substrate is reduced by an amount greater than an affect of the neutral radicals of said first gas on said substrate is reduced.

3. A substrate treatment apparatus according to claim 2, wherein said first gas contained in said first gas source is fluorine and said first gas source is a fluorine gas source, and said second gas contained in said second gas source is oxygen and said second gas source is an oxygen gas source.

* * * * *